United States Patent
Guo et al.

[19]

[11] Patent Number: 6,110,828

[45] Date of Patent: Aug. 29, 2000

[54] IN-SITU CAPPED ALUMINUM PLUG (CAP) PROCESS USING SELECTIVE CVD AL FOR INTEGRATED PLUG/INTERCONNECT METALLIZATION

[75] Inventors: Ted Guo, Palo Alto; Liang-Yuh Chen, San Jose; Suchitra Subrahmanyan, Sunnyvale, all of Calif.

[73] Assignee: Applied Materials, Inc., Santa Clara, Calif.

[21] Appl. No.: 08/791,653

[22] Filed: Dec. 30, 1996

[51] Int. Cl.$^7$ ................................................. H01L 21/443
[52] U.S. Cl. .................... 438/688; 438/672; 438/680; 438/653; 438/656
[58] Field of Search .................... 438/627, 634, 438/637, 641, 648, 688, 680, 681, 685, 653, 654, 656, 672

[56] References Cited

U.S. PATENT DOCUMENTS

| | | |
|---|---|---|
| 4,920,072 | 4/1990 | Keller et al. . |
| 4,960,732 | 10/1990 | Dixit et al. . |
| 4,985,750 | 1/1991 | Hoshino . |
| 4,994,410 | 2/1991 | Sun et al. . |
| 5,032,233 | 7/1991 | Yu et al. . |
| 5,081,064 | 1/1992 | Inoue et al. . |
| 5,147,819 | 9/1992 | Yu et al. . |
| 5,151,305 | 9/1992 | Matsumoto et al. . |
| 5,371,042 | 12/1994 | Ong . |
| 5,393,703 | 2/1995 | Olowolafe et al. . |
| 5,403,779 | 4/1995 | Joshi et al. . |
| 5,514,425 | 5/1996 | Ito et al. . |
| 5,523,259 | 6/1996 | Merchant et al. . |
| 5,585,308 | 12/1996 | Sardella . |
| 5,585,673 | 12/1996 | Joshi et al. . |

FOREIGN PATENT DOCUMENTS

| | | |
|---|---|---|
| 0448223A2 | 9/1991 | European Pat. Off. . |
| 0519352A2 | 12/1992 | European Pat. Off. . |
| 0608628A2 | 8/1994 | European Pat. Off. . |
| 0735586A2 | 10/1996 | European Pat. Off. . |
| 0805490A1 | 11/1997 | European Pat. Off. . |
| 3743591A1 | 7/1988 | Germany . |
| 8-10693 | 1/1986 | Japan . |
| 08097287 | 4/1996 | Japan . |
| 2513900 | 4/1996 | Japan . |
| 63033569 | 2/1998 | Japan . |

OTHER PUBLICATIONS

Aluminum Chemical Vapor Deposition with New Gas Phase Pretreatment Using Tetrakisdimethylamino–Titanium for Ultralarge–Scale Integrated Circuit, K. Sugai, H. Okabayashi, T. Shinzawa, S. Kishida, A. Kobayashi, T. Yako, and H. Kadokura, Jun. 16, 1995, (pp. 2115–2118).

European Search Report Dated Aug. 5, 1999, EP97310667.

Komiya, et al., "Direct Formation of Selective CVD–AL Contact Plug on Titanimu Silicide Obtained by Silicidation Titanium Including Nitrogen," International Conference on Solid State Devices and Materials, Aug. 1995, pp. 315–317.

Tsubouchi, et al., "Complete Planarization of Via Holes with Aluminum by Selective and Nonselective Chemical Vapor Deposition," Applied Physics Letters, vol. 57, No. 12, Sep. 1990, pp. 1221–1223.

*Primary Examiner*—Caridad Everhart
*Attorney, Agent, or Firm*—Thomason, Moser & Patterson

[57] ABSTRACT

The present invention generally provides a method of forming a structure having a selective CVD metal plug with a continuous barrier layer formed thereon. More particularly, the present invention applies a thin layer of warm PVD metal over a selective CVD metal plug and adjacent nodules on the dielectric field to planarize the metal surface. A barrier is then deposited over the planarized metal surface. Therefore, the invention provides the advantages of having (1) void-free, sub-half micron selective CVD metal via plugs and interconnects, and (2) a reduced number of process steps without the use of CMP, and (3) barrier layers over the metal plugs to improve the electromigration resistance of the metal.

22 Claims, 5 Drawing Sheets

IN-SITU CAPPED ALUMINUM PLUG (CAP) PROCESS USING SELECTIVE CVD AL FOR INTEGRATED PLUG/INTERCONNECT METALLIZATION

BACKGROUND OF THE INVENTION

1. Field of the Invention

The present invention relates to a metallization method for manufacturing integrated circuits. More particularly, the present invention relates to selective metallization of an interconnect in insulative layers to form void-free plugs between conducting layers, including apertures such as contacts or vias in high aspect ratio sub-half micron applications.

2. Background of the Related Art

Sub-half micron multilevel metallization is one of the key technologies for the next generation of very large scale integration (VLSI). The multilevel interconnects that lie at the heart of this technology require planarization of interconnect features formed in high aspect ratio apertures, including contacts, vias, troughs and other features. Reliable formation of these interconnect features is very important to the success of VLSI and to the continued effort to increase circuit density and quality on individual substrates and die.

As circuit densities increase, the widths of vias, contacts and other features, as well as the dielectric materials between them, must decrease. Therefore, there is a great amount of ongoing effort being directed at the formation of smaller and smaller void-free features. One such method involves selective chemical vapor deposition (CVD) of material only on exposed nucleation surfaces as provided on the substrate surface. Selective CVD involves the deposition of a film layer when a precursor gas contacts a "nucleation site" on the substrate. The precursor gas decomposes (reacts) at nucleation sites, deposits a metal layer on which further deposition occurs, and forms various gaseous by-products that are exhausted from the chamber.

Selective CVD Al deposition is based on the fact that the decomposition of a CVD Al precursor gas usually requires a source of electrons from a conductive nucleation film. In accordance with a conventional selective CVD Al deposition process, Al should grow on the surface of an underlying conductive layer, such as a metal film, doped silicon or metal silicide, that has been exposed in the bottom of an aperture. Conversely, Al should not grow on dielectric surfaces such as the dielectric field and aperture walls. Because the underlying conductive layers supply electrons needed for decomposition of the Al precursor gas, but the dielectric field and aperture walls do not, the resulting deposition of Al is said to be "selective". Selective deposition can provide epitaxial, "bottom-up" growth of CVD Al in the apertures that is capable of filling very small dimension (<0.25 $\mu$m), high aspect ratio (>5:1) via or contact openings.

Figure 1:
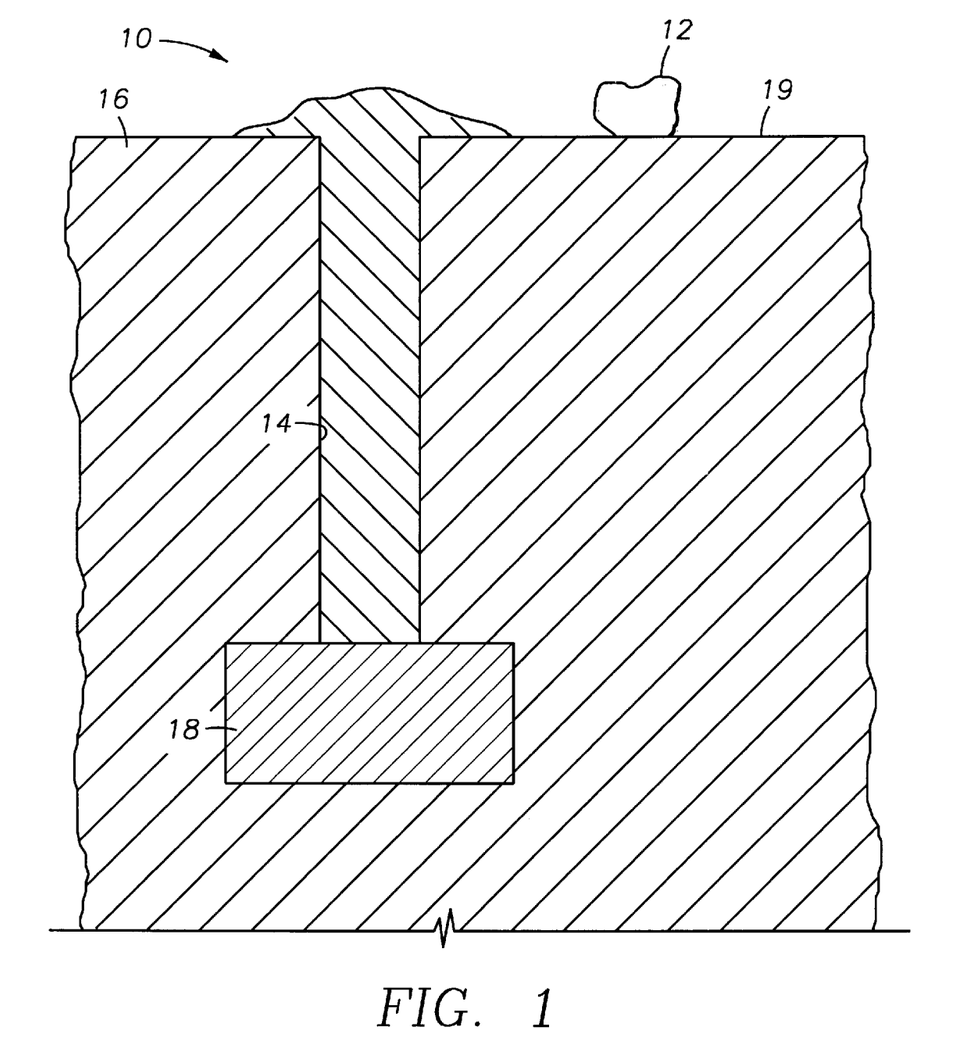
FIG. 1 is a cross-sectional view of an integrated circuit structure having a metal plug formed in a via by selective CVD Al and nodules formed on the dielectric field.

Referring to FIG. 1, a schematic diagram of an integrated circuit structure 10 shows a metal interconnect formed in via 14 that was selectively nucleated by the conducting member 18 and uniformly grown upward towards the surface 19 of the dielectric layer 16. However, selective deposition can also occur at the location of surface defects that are almost always present on the dielectric field and aperture sidewalls. These defects can provide free electrons and thus serve as nucleation sites for CVD Al growth that forms unwanted CVD Al nodules 12 on the surface 19 and the walls of the apertures.

Various methods have been used to minimize this loss of selectivity and the formation of nodules. These methods have included, for example, preconditioning of the dielectric surface before the selective deposition process and planarization of the device, such as by chemical mechanical polishing (CMP), following selective deposition to remove the nodules 12 formed on the wafer surface 20. However, these methods complicate the processing steps required to form the desired circuit structures and significantly increase the expense of the integrated circuit manufacturing process. In addition, adding steps to the overall process increases the likelihood that defects may result in the circuit structures being formed.

Furthermore, aluminum plugs and interconnects have been found to exhibit electromigration or transport of aluminum atoms due to current flow, resulting in voids and line failure. Electromigration is a problem that gets worse as the level of integration increases and the effects of electromigration appear only after a period of use.

One method for reducing electromigration in integrated circuits is it to use copper and its alloys which have even lower resistivities than aluminum and significantly higher electromigration resistance. These characteristics are important for supporting higher current densities, such as those experienced at high levels of integration. However, the primary problem with integrating copper metal into multilevel metallization systems is the difficulty of patterning the metal using etch techniques. For devices of submicron minimum feature size, wet etch techniques for copper patterning have not been acceptable due to liquid surface tension, isotropic etch profile, and difficulty in over-etch control. Furthermore, a reliable process for selective CVD copper is not available.

It has been known that the electromigration performance of aluminum can be dramatically improved by forming a barrier or capping layer between aluminum features. However, the presence of CVD Al nodules on the dielectric field following selective CVD Al plug formation prevents the direct deposition of a smooth, uniform and continuous capping. Presently, chemical mechanical polishing must be used to remove the selective CVD Al nodules before the capping layer can be deposited. This expensive and complex process involves several additional steps, including a break in the process vacuum causing unnecessary contamination of the substrate surface.

Therefore, there remains a need for a simple method for forming a selective CVD Al via/contact plug and an PVD Al interconnect having a smooth, continuous and uniform capping layer therebetween. More particularly, there is a need for a method providing an integrated plug/interconnect metallization with improved electromigration performance. It would be desirable if this method did not require chemical mechanical polishing (CMP). It would also be desirable if the method was simple and could be performed entirely within an integrated cluster tool. It would be even more desirable if the method provided a low temperature deposition for sub-quarter micron Al plug fill.

SUMMARY OF THE INVENTION

The present invention provides a method of forming a capped metal plug in a via through a dielectric layer, wherein the via has a floor exposing a deposition enhancing material, comprising the steps of: (a) selectively chemical vapor depositing a metal, such as CVD Al, over a deposition enhancing material of the via floor to form a plug in the via; (b) physical vapor depositing a sufficient amount of a metal, such as PVD Al or PVD AlCu, over the dielectric layer to substantially planarize any nodules formed by loss of selectivity during plug formation; and (c) depositing a barrier layer over the physical vapor deposited metal. It is preferred that the PVD metal be deposited at a temperature between about 350° C. and about 500° C., most preferably about 400° C. Furthermore, the preferred barrier layer comprises a first sublayer of titanium, a second sublayer of titanium nitride and a third sublayer of titanium. A second metal layer, such as PVD Al, is then deposited over the barrier layer. The process is preferably performed in an integrated processing system comprising a chemical vapor deposition chamber and a physical vapor deposition chamber in order to improve the interface by avoiding formation of an oxide layer or exposure to the surrounding atmosphere.

In another aspect of the invention, a method is provided for forming a metal via plug through a dielectric layer having barrier layers at each end of the plug. The method comprises the steps of: (a) depositing a metal stack (e.g., Ti/TiN/Al, Ti/TiN/Al/TiN or Ti/TiN/W) on the top layer of a workpiece; (b) forming a dielectric layer over the metal stack; (c) etching a via through the dielectric layer to form a floor exposing the metal stack; (d) selectively chemical vapor depositing a conductive material on the exposed portion of the metal stack to form a plug in the via; (e) physical vapor depositing a sufficient amount of a metal over the dielectric layer to substantially planarize any nodules formed by loss of selectivity during plug formation; and (f) depositing a barrier cap layer over the physical vapor deposited metal. The method may also include depositing a second metal layer, such as PVD Al, over the barrier cap layer. A multilevel integrated circuit having barrier layers between each metallization layer can then be formed by etching the metal stack, then repeating the steps beginning with (b).

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In one aspect of the present invention, a method is provided for forming a capped aluminum plug (CAP) having a smooth, continuous and uniform barrier cap layer over a selective chemical vapor deposition (CVD) metal plug. More particularly, the present invention applies a warm physical vapor deposition (PVD) layer over a dielectric field having metal nodules formed thereon, typically due to a loss of selectivity, in order to absorb or planarize the nodules before deposition of the barrier cap layer. A smooth, continuous and uniform barrier cap layer, such as the sequential deposition of Ti/TiN/Ti, can then be formed, followed by deposition of a metal interconnect layer, such as PVD aluminum (Al). Therefore, the invention provides the advantages of (1) a void-free, sub-half micron selective CVD metal via plug, (2) a smooth, uniform barrier cap layer formed over the metal plugs to improve the electromigration resistance of the adjacent plug/interconnect metallization, (3) a simpler process having fewer steps, (4) an integrated low temperature fill process that is compatible with low dielectric constant organic materials, (5) avoidance of chemical mechanical polishing (CMP), and (6) improved texture (i.e., crystal orientation) on the top surface of the plug.

In another aspect of the present invention, a method is provided for forming smooth, continuous and uniform barrier layers between metal features on multiple levels to increase the electromigration resistance throughout the integrated circuit. The method includes formation of a CAP structure, as described above, subsequent or prior to formation of another dielectric or metallization layer having a barrier layer formed thereon. These steps can be repeated to form a multilevel integrated circuit having barrier layers between each layer of metal features, particularly wherein the metal features are aluminum.

Referring to FIGS. 2 through 8, cross-sectional diagrams of a structure 20 are shown at each step of an exemplary integrated circuit fabrication process of the present invention that provides a barrier layer between multiple layers. One aspect of this process, as shown in FIGS. 5 through 8, includes the CAP process of the present invention. It should be recognized that certain steps described with reference to FIGS. 2–8 may be combined or provided by using prefabricated structures and still be within the scope of the present invention.

Figure 2:
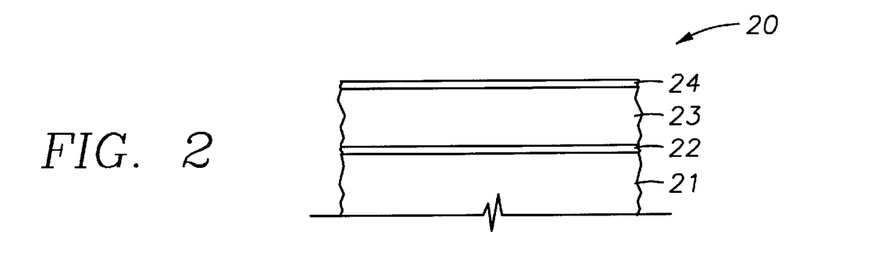
FIG. 2 is a cross-sectional view of a metallization structure formed on a substrate.

Referring to FIG. 2, the structure 20 is a metallization stack that represents a top layer of an integrated circuit feature formed on a substrate 21. The metallization stack may take on a variety of configurations, but is shown here in a preferred configuration as including a titanium (Ti) layer 22 over the substrate 21, an aluminum/copper (AlCu) layer 23 over the Ti layer 22, and a titanium nitride (TiN) layer 24 over the AlCu layer 23. This stack may be formed by any conventional technique(s), including chemical and physical vapor deposition.

The barrier layer 24 is formed over the AlCu layer 23 to prevent interaction of layer 23 with features formed above the barrier layer and also to serve as a nucleation layer for subsequent deposition in accordance with the present invention. The barrier layer may comprise any suitable nucleation or deposition enhancing material, including conductive metals, that increases the electromigration resistance of features in contact therewith. The barrier layer is preferably comprised of titanium (Ti), titanium nitride (TiN), or a combination thereof and preferably has a thickness between about 100 and about 500 Angstroms (Å). The most preferred barrier layer is formed by the three consecutive layers Ti/TiN having a total thickness of about 400 Å.

Figure 3:
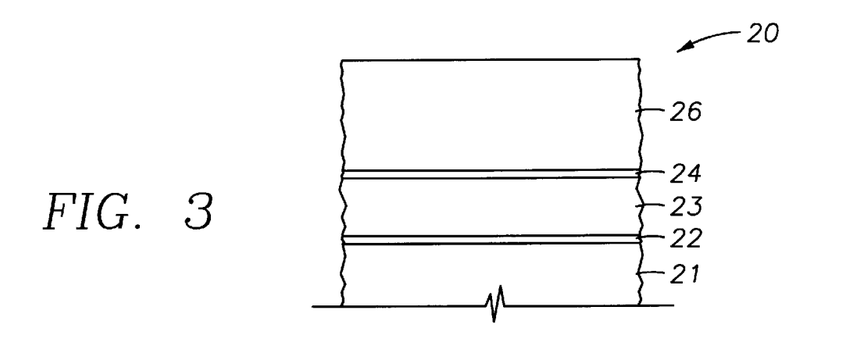
FIG. 3 is a cross-sectional view of the structure of FIG. 2 following deposition of a dielectric layer.

Referring to FIG. 3, a dielectric layer 26 is formed over the barrier layer 24 in accordance with procedures known in the art to form a part of the overall integrated circuit. Any etchable dielectric material, whether presently known or yet to be discovered, may be used within the scope of the present invention.

Figure 4:
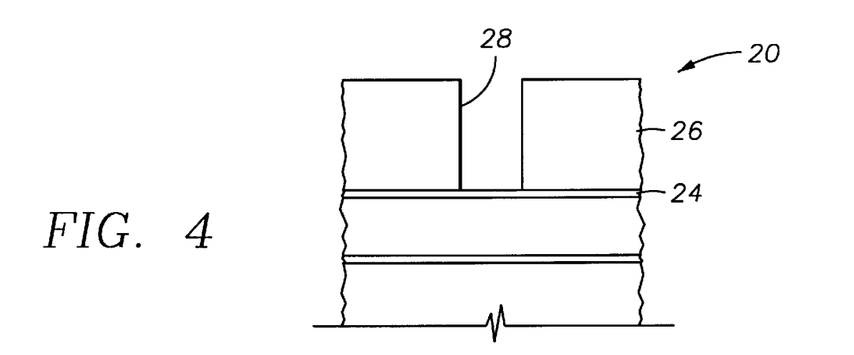
FIG. 4 is a cross-sectional view of the structure of FIG. 3 following the etch of the dielectric layer to form a via or trough exposing an underlying barrier layer.

Referring to FIG. 4, a cross-sectional view of the structure 20 of FIG. 3 is shown following formation of a via 28 in the dielectric layer 26 to expose a portion of the underlying barrier layer 24. Any etch process, such as plasma etch, may be used within the scope of the invention to form the via. Specific techniques for etching dielectric materials, such as silicon dioxide and some organic materials, may include such compounds as buffered hydrofluoric acid and acetone or EKC, respectively. However, the most preferred etch processes are those that are able to form sub-half micron, or even sub-quarter micron, apertures and vias 28 in the dielectric layer 26 while preserving the integrity of the barrier layer 24 therebelow.

The via 28 thus formed is generally intended to facilitate the deposition of a conductive plug therein that will provide an electrical connection with an underlying conductive member 22,23,24 of the metallization stack. The via 28 provides non-electrically conducting, dielectric walls and a floor exposing at least a portion of the deposition enhancing material of barrier layer 24. It is preferred that a pre-metallization treatment be used to clean the via or contact prior to CVD metallization.

Selective CVD Al processes are based on the decomposition of a metal precursor on an electrically conductive surface. For example, a CVD Al film can be formed by the decomposition reaction of dimethyl aluminum hydride ("DMAH") with a carrier gas, for example hydrogen (H$_2$) or argon (Ar). This particular reaction occurs much more rapidly when DMAH comes in contact with a deposition enhancing material that is an electron donor, such as the surface of an electrically conductive material. Therefore, it is possible to achieve at least some measure of control or selectivity over where and how the CVD Al is deposited by preparing a structure with some surfaces that are conductive (the barrier layer 24 exposed on the via floor) and some surfaces that are nonconductive (the via 28 walls).

Figure 5:
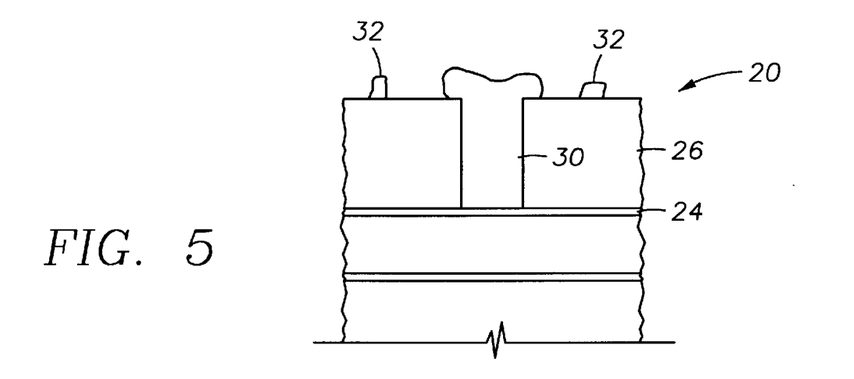
FIG. 5 is a cross-sectional view of the structure of FIG. 4 following selective CVD Al plug formation on an underlying barrier layer to fill the via.

Referring to FIG. 5, a cross-sectional view of the structure 20 of FIG. 4 is shown following formation of a selective CVD Al plug 30 on the underlying barrier layer 24. Selective CVD Al provides epitaxial growth of a void-free, single crystal plug 30. However, despite the relative selectivity of the CVD Al, small amounts of the CVD Al can also deposit wherever surface defects are present on the non-conductive dielectric layer 26 to form metal nodules 32 thereon.

While CVD Al may be deposited under various conditions, a typical process involves substrate temperatures of between about 120° C. and about 280° C. and a deposition rate of between about 20 Å/second and about 2000 Å/second, preferably about 1500 Å/second. Deposition of CVD Al may be performed at chamber pressures between about 1 torr and about 80 torr, with the preferred chamber pressure being about 25 torr. The preferred deposition reaction for CVD Al involves the decomposition of dimethyl aluminum hydride ("DMAH") according to one of the following equations:

or

Deposition within the via 28 to form metal plug 30 is selective because only the exposed surface of the underlying conductive layer 24 promotes the decomposition reaction that deposits the CVD Al. Therefore, the CVD Al is deposited from the floor upward to fill the via 28 without any substantial CVD Al deposition on the via walls.

Furthermore, the via 28 comprises both the substantially non-conductive dielectric walls and the conductive floor. As discussed above, substantially non-conducting materials, such as the dielectric walls of the aperture, are not good electron donors and, therefore, do not provide good nucleation for decomposition of the CVD metal precursor. Rather, CVD metal films begin to form on the exposed conducting surface of the via floor. After an initial layer of the metal has been deposited on the via floor, subsequent deposition occurs more easily so that the metal grows from the via floor upward or outward to fill the via.

Although defects on the dielectric wall of the via may cause the formation of scattered nodules within the aperture, these nodules typically do not block the aperture or cause voids within the aperture because nodule formation occurs at a much slower rate than selective growth. The via is filled with metal from the floor upward before a nodule has an opportunity to grow across the via and form a void therein, even in a via having an aspect ratio as high as 5:1, because the conducting via floor exposes a much larger surface area than typical defects.

Figure 6:
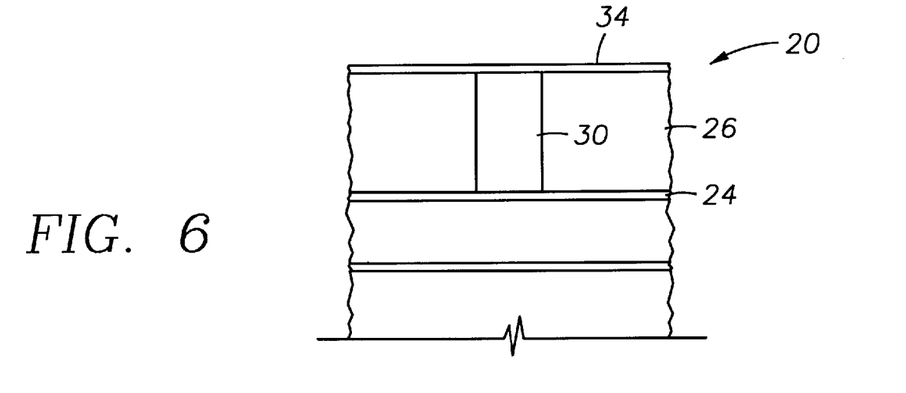
FIG. 6 is a cross-sectional view of the integrated circuit structure of FIG. 5 following the planarization of the nodules by applying a thin, warm PVD AlCu layer.

Referring to FIG. 6, a cross-sectional view of the structure 20 of FIG. 5 is shown following the planarization of the nodules 32 (see FIG. 6) by applying a thin, PVD Al or PVD AlCu layer 34. The metal is deposited over the dielectric layer 26 in a sufficient amount and at a sufficient temperature to substantially planarize any nodules formed by loss of selectivity during formation of the plug 30. The PVD metal layer 34 is deposited at a temperature between about 350° C. and about 500° C., preferably at about 400° C., to a thickness between about 100 Angstroms (Å) and about 1200 (Å). This PVD step smooths out the CVD Al nodules by absorbing or planarizing them to form a uniform, thin Al layer 34.

Figure 7:
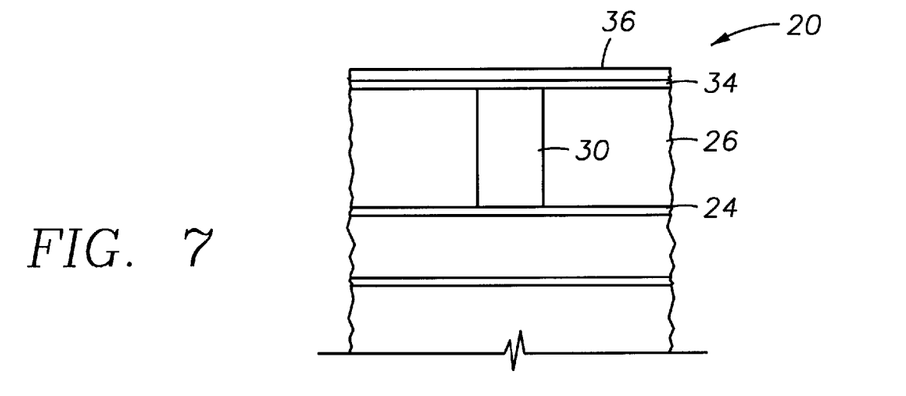
FIG. 7 is a cross-sectional view of the structure of FIG. 6 following the application of a barrier layer.
Figure 8:
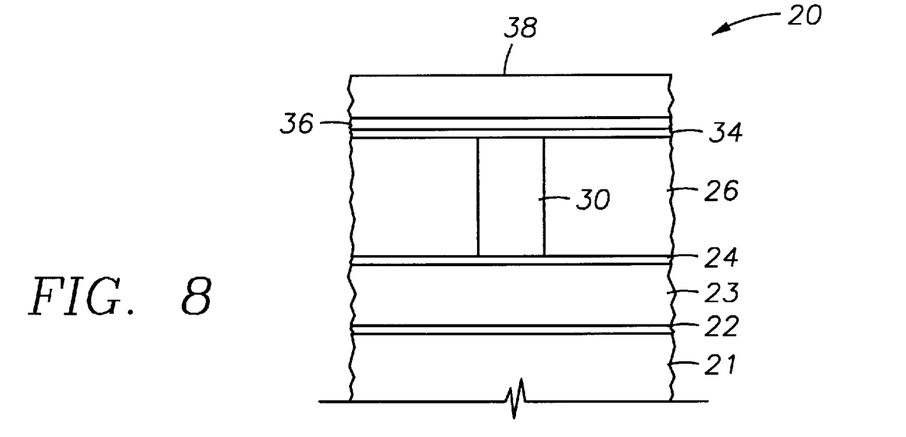
FIG. 8 is a cross-sectional view of the structure of FIG. 7 following the application of a standard PVD Al layer.

Referring to FIG. 7, a cross-sectional view of the structure 20 of FIG. 6 is shown following the application of a barrier layer 36 over the PVD Al or AlCu 34. The structure 30,34,36 formed above stack 22,23,34 and dielectric layer 26 of FIG. 8 is referred to herein as a capped aluminum plug (CAP) structure, because the barrier layer "caps" the aluminum plug. This barrier layer 36 is preferably a PVD layer selected from the group consisting of titanium (Ti), titanium nitride (TiN), tantalum (Ta), tantalum nitride (TaN) and combinations thereof. The most prefered barrier cap layer 36 is formed by the three consecutive layers Ti/TiN/Ti. The barrier layer serves to limit interaction between the aluminum plug and subsequently deposited aluminum interconnect or other feature. The barrier layer 36, thereby improves the electromigration resistance and reliability of the Al plug 30. While the barrier layer 36 may have any thickness with the scope of the present invention, the preferred thickness of a Ti/TiN/Ti layer is between about 300 Å and about 500 Å, with a most preferred thickness of about 400 Å. The TiN portion of the barrier layer may be formed by either CVD or PVD processes, but PVD TiN is preferred. Furthermore, the Ti portion of the barrier layer is preferably formed by PVD Ti.

Referring to FIG. 8, a cross-sectional view of the structure 20 of FIG. 7 is shown following the application of a standard PVD Al or AlCu layer 38 to provide the interconnect metallization. The PVD Al or AlCu interconnect is formed over the CAP structure of FIG. 7 to provide an integrated plug/interconnect metallization having improved electromigration performance in both the plug and interconnect. It should be recognized that additional processing or layers, including another barrier layer, may be formed over the PVD Al layer within the scope of the present invention. In fact, it should be recognized that the entire process may be repeated any number of times.

In another aspect of the invention, a plug or interconnect may be formed over a barrier layer or CAP structure in a manner that provides a high degree of crystal orientation and preferential reflectivity improvement on the field (PRIME). Crystal orientation in the plug or interconnect is improved by depositing an ultra-thin or epsilon ($\in$) layer of a self-aligning material over the surface of the barrier layer prior to depositing the dielectric layer and metal plug or over the dielectric field prior to depositing the interconnect by either PVD or CVD techniques.

The epsilon material being deposited over the barrier layer 36 typically comprises Ti, TiN, or a combination thereof. The reflectivity of the electrically conducting plug or interconnect formed over an epsilon layer is improved vis-a-vis interconnect formed over other nucleation layers. An epsilon layer may be formed of a single material or it may be formed of a combination of materials selected from the group consisting of titanium, titanium nitride, aluminum, Nb, aluminum, and Ta.

Depositing a small quantity of material before depositing a conducting film thereover improves the reflectivity of that film by facilitating the growth of a highly oriented crystal structure within the film. The thin, self-aligning epsilon layer, such as a Ti layer, is preferably about 50 Å thick and is preferably deposited over the field using PVD techniques to provide a surface on which a conducting metal plug or interconnect can then be deposited. The thin, self-aligning epsilon TiN layer is preferably deposited by sputtering a target of refractory material in a nitrogen rich atmosphere to provide a flux of TiN, a portion of which will deposit on the substrate. The conducting layer deposited over the epsilon layer has reflectivity, measured at 436 $\mu$m with a silicon baseline, that is about 30% greater than conducting layers deposited directly onto the barrier layer without an epsilon layer.

The thin self-aligning epsilon layer enhances the crystal orientation as well as provides a large crystal structure in the resulting plug or interconnect. In addition to a single Ti/TiN nucleation layer, it has further been found by the inventors that a combination of a Ti/TiN, Ti/Al layer, TiN/Ti layer or any combination thereof may be deposited as the epsilon layer on the substrate to promote large crystal formation and <111> crystal orientation in the deposited Al film. Improving the crystal structure of the resulting film enhances the electrical properties and reduces stress within the film. It is believed that the orientation may be improved by subsequently depositing an epsilon layer of PVD Al over the epsilon Ti or TiN layer so that the TiN or Ti layer cannot chemically bind to other reactive species within the chamber, e.g., carbon.

The thin self-aligning epsilon film may comprise a single atomic layer or monolayer of a single material or it may comprise atomic layers or monolayers of multiple materials deposited in sequence. It is most preferred that the self-aligning material be dispersed, preferably generally uniformly on a gross scale, over the desired surface to enhance film formation thereon. The self-aligning nucleation material will typically be a conductive material, such as a metal, capable of providing electrons to facilitate the reaction thereof and crystallization of a deposited conducting film layer (such as a metal CVD precursor). The preferred nucleation layer is comprised of conductive materials such as titanium (Ti), aluminum (Al), titanium nitride (TiN), copper (Cu) and silicon (Si).

Figure 9:
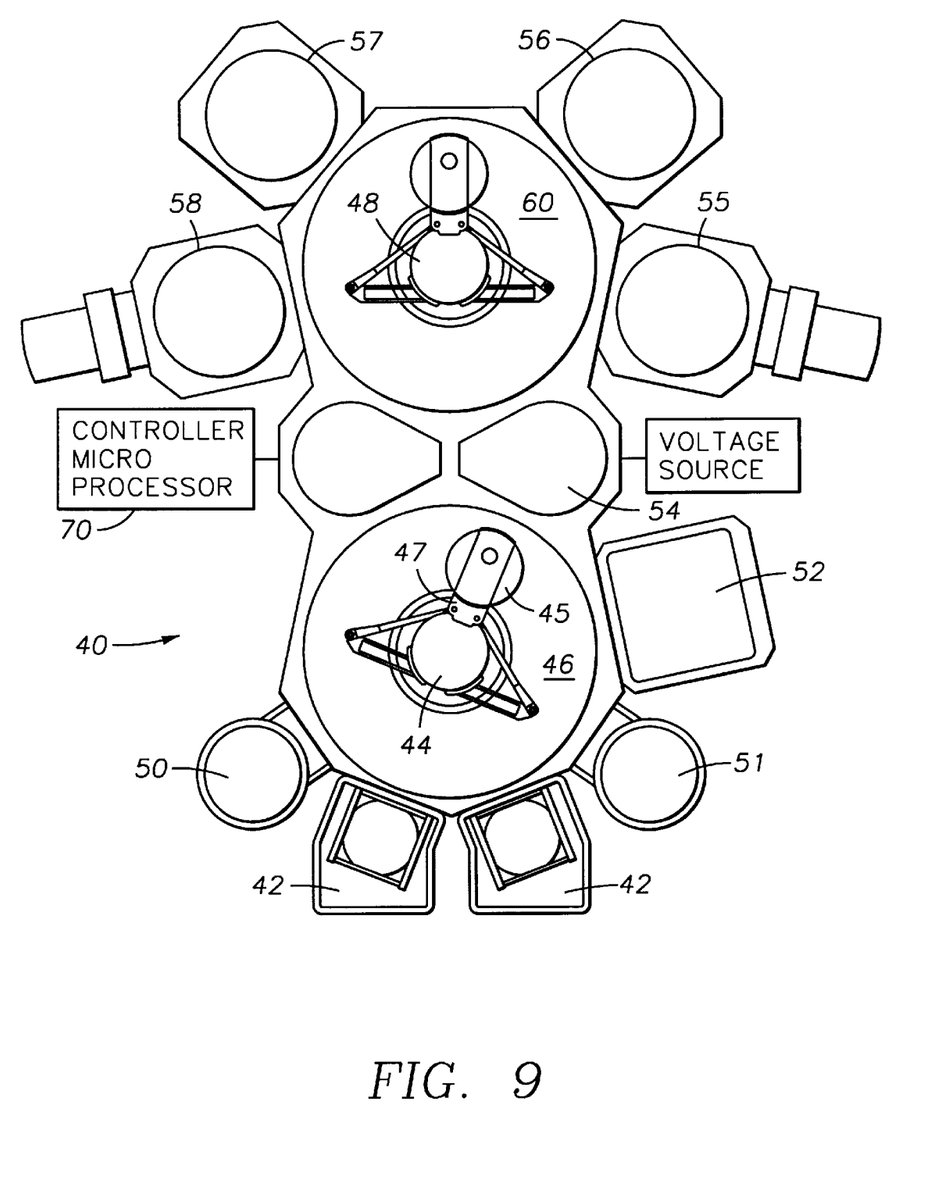
FIG. 9 is a plan view of an integrated cluster tool for performing both chemical vapor deposition (CVD) and physical vapor deposition (PVD).

Furthermore, it is preferred that the deposition steps of the present invention be performed in an integrated cluster tool including both CVD and PVD process chambers. Referring to FIG. 9, a schematic diagram of an exemplary integrated cluster tool 40 is shown. Typically, substrates are introduced and withdrawn from the cluster tool 40 through a cassette loadlock 42. A robot 44 having a blade 47 is located within the cluster tool to move the substrates 45 through the cluster tool. One robot 44 is typically positioned in a buffer chamber 46 to transfer substrates between the cassette loadlock 42, degas wafer orientation chamber 50, preclean chamber 51, PVD TiN ARC chamber 52 and cooldown chamber 54. A second robot 48 is located in transfer chamber 60 to transfer substrates to and from the cooldown chamber 54, coherent Ti chamber 55, CVD TiN chamber 56, CVD Al chamber 57 and PVD AlCu processing chamber 58. The transfer chamber 60 in the integrated system is preferably maintained at a vacuum between about $10^{-6}$ and about $10^{-9}$ torr. The configuration of the chambers in FIG. 9 comprise an integrated processing system capable of both CVD and PVD processes in a single cluster tool. The specific chamber configuration is merely illustrative and should not be taken as limiting the application of the present invention.

In accordance with the present invention, a substrate may receive a metallization stack over its surface as a result of previous processing by other chambers, cluster tools or systems. A typical metallization stack formed over a silicon wafer includes a thin Ti layer, an AlCu layer and a thin TiN layer. Furthermore, the stack may already have received a first interlevel dielectric layer that is patterned and etched to form vias using procedures known in the art. A substrate having a first metallization stack and vias etched into the dielectric layer is then further processed, preferably in the cluster tool 40, to form a capped aluminum plug (CAP) within the via as described above.

In a preferred process performed in a cluster tool 40, the CAP is formed by passing the substrate from the cassette loadlock 42 to the buffer chamber 46 where the robot 44 first moves the substrate 35 into a degas chamber 50, then perhaps to a preclean chamber 51. The substrate may then be transferred by the robot 48 into and between a CVD Al chamber 57 to form the plug and a PVD Al or AlCu chamber 58 to planarize any nodules formed over the dielectric field. The planarized structure then receives a barrier layer in one or more of chambers 55,56. Most preferably, the structure receives three consecutive layer by being transferred to PVD Ti chamber 55, CVD TiN chamber 56 then back to PVD Ti chamber 55. The robot 48 then sends the substrate back to the cooldown chamber 54. It is anticipated that the substrate may be processed or cooled in one or more chambers any number of times in any order to accomplish fabrication of a desired structure on the substrate. The substrate is removed from the cluster tool, following formation of the CAP, through the buffer chamber 46 and then to the loadlock 42. A microprocessor controller 70 is provided to control movement of the substrates throughout the system and the sequence and formation of the desired film layers on the substrates.

A staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference.

Figure 10:
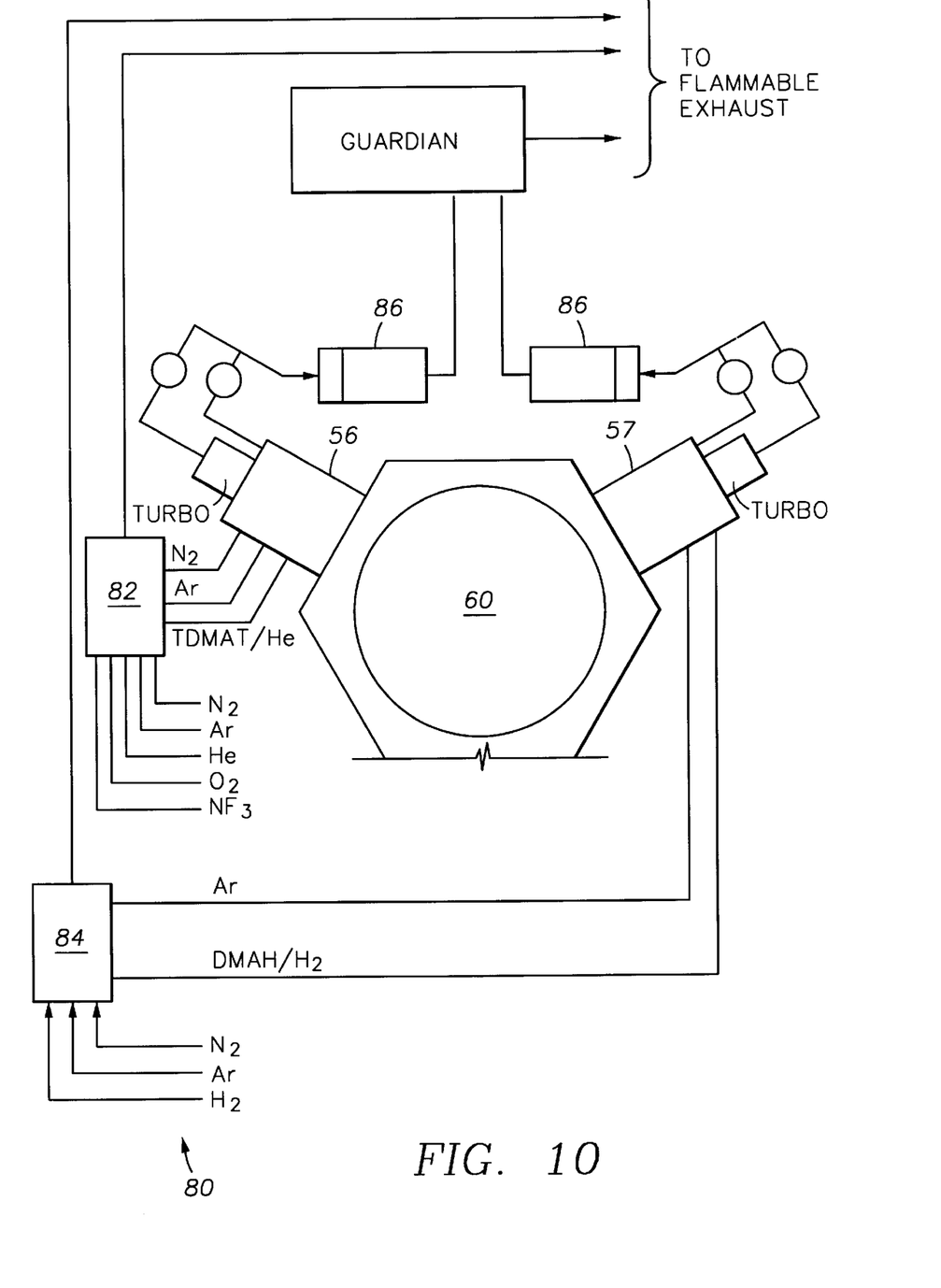
FIG. 10 is a schematic diagram of a gas box system for supplying gases to the CVD chambers on the cluster tool of FIG. 9.

Referring to FIG. 10, a gas box system 80 for supplying gases to the CVD chambers of the system is illustrated. The CVD Al gas box 84 is supplied with $N_2$, Ar and $H_2$. The precursor gas dimethyl aluminum hydride ("DMAH") and a carrier gas, such as $H_2$ or Ar, are passed into the CVD Al chamber 57 for deposition of aluminum. Chamber 57 is equipped with a turbo pump for providing a vacuum in the chamber and a blower/dry pump 86.

While PVD TiN is preferred, CVD TiN may be used according to the present invention. Where CVD TiN is used, a gas box 82 is supplied with $N_2$, Ar, He, $O_2$, $NF_3$ and $H_2$. The reactant tetrakis dimethyl amino titanium ("TDMAT"), along with the inert gas Ar and $N_2$, are passed into the CVD TiN chamber 56 for processing. Chamber 56 is also equipped with a turbo pump for providing a vacuum in the chamber and a blower/dry pump 86.

While the foregoing is directed to the preferred embodiment of the present invention, other and further embodiments of the invention may be devised without departing from the basic scope thereof. The scope of the invention is determined by the claims which follow.

What is claimed is:

1. A method of forming a capped metal plug in a via through a dielectric layer, wherein the via has a floor exposing a deposition enhancing material, comprising the steps of:

a) selectively chemical vapor depositing a metal on the deposition enhancing material of the via floor to form a plug in the via;

b) physical vapor depositing a sufficient amount of a warm metal over the dielectric layer to substantially planarize any nodules on the dielectric layer, wherein the physical vapor deposited metal has a thickness below about 1200 Å; and c) depositing a barrier layer over the physical vapor deposited metal.

2. The method of claim 1, wherein the selectively chemical vapor deposited metal is CVD Al.

3. The method of claim 2, wherein the warm PVD metal is warm PVD Al.

4. The method of claim 2, wherein the warm PVD metal is warm PVD AlCu.

5. The method of claim 2, wherein the warm PVD metal is deposited at a temperature between about 350° C. and about 500° C.

6. The method of claim 5, wherein the warm PVD metal is deposited at a temperature of about 400° C.

7. The method of claim 1, wherein the barrier layer comprises a metal selected from the group consisting of titanium, titanium nitride, tantalum and tantalum nitride.

8. The method of claim 1, wherein the barrier layer comprises a first sublayer of titanium, a second sublayer of titanium nitride and a third sublayer of titanium.

9. The method of claim 1 further comprising the step of:
   (d) depositing a second metal layer over the barrier layer.

10. The method of claim 9, wherein the second metal layer is comprised of PVD Al, CVD Al, Cu or combinations thereof.

11. The method of claim 1, further comprising the step of:
    (d) forming a metal interconnect over the barrier layer.

12. The method of claim 11, wherein the metal interconnect comprises aluminum.

13. The method of claim 1, wherein steps (a) through (c) are performed in an integrated processing system comprising a chemical vapor deposition chamber and a physical vapor deposition chamber.

14. A method of forming a via plug through a dielectric layer having barrier layers at each end of the plug, comprising the steps of:

a) depositing a barrier layer on the top layer of a workpiece;

b) forming a dielectric layer over the barrier layer;

c) etching a via through the dielectric layer to form a floor exposing the barrier layer;

d) selectively chemical vapor depositing a conductive material on the exposed portion of the barrier layer to form a plug in the via;

e) physical vapor depositing a sufficient amount of a warm metal over the dielectric layer to substantially planarize any nodules formed by loss of selectivity during plug formation, wherein the warm physical vapor deposited metal has a thickness from about 100 Å to about 1200 Å; and f) depositing a barrier cap layer over the warm physical vapor deposited metal.

15. The method of claim 14, wherein both barrier layers comprise a metal selected from the group consisting of titanium, titanium nitride, tantalum and tantalum nitride.

16. The method of claim 14, further comprising the step of:
    (g) depositing a second metal layer over the barrier cap layer.

17. The method of claim 14, further comprising the step of:
    (g) depositing a second metal layer over the barrier cap layer; and
    (h) depositing another barrier layer over the second metal layer.

18. The method of claim 17, further comprising the step of repeating steps (b) through (h).

19. The method of claim 16, wherein the second metal layer comprises PVD Al.

20. The method of claim 1, wherein the physical vapor deposited metal has a thickness from about 100 Å to about 1200 Å.

21. The method of claim 1, wherein the physical vapor deposited metal has a thickness less than the depth of the via.

22. The method of claim 14, wherein the warm physical vapor deposited metal has a thickness less than the depth of the via.

* * * * *